United States Patent
Larsson

(12) 
(10) Patent No.: US 6,222,895 B1
(45) Date of Patent: Apr. 24, 2001

(54) PHASE-LOCKED LOOP (PLL) CIRCUIT CONTAINING A SAMPLED PHASE DETECTOR WITH REDUCED JITTER

(75) Inventor: Patrik Larsson, Matawan, NJ (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/014,861

(22) Filed: Jan. 28, 1998

(51) Int. Cl.[7] .................................. H03D 3/24; H03L 7/08
(52) U.S. Cl. ................................. 375/376; 331/17; 331/25
(58) Field of Search .............................. 375/376; 331/17, 331/25

(56) References Cited

U.S. PATENT DOCUMENTS

| | | | |
|---|---|---|---|
| 4,535,459 | * 8/1985 | Hogge, Jr. ............................. | 375/324 |
| 4,562,411 | * 12/1985 | O'Rourke et al. .................... | 331/1 A |
| 5,448,598 | * 9/1995 | Yousefi et al. ........................ | 375/376 |
| 5,699,387 | * 12/1997 | Seto et al. ............................. | 375/376 |
| 5,926,041 | * 6/1999 | Duffy et al. ........................... | 327/12 |
| 5,945,855 | * 8/1999 | Momtaz ................................ | 327/157 |
| 6,005,425 | * 12/1999 | Cho ...................................... | 327/156 |

OTHER PUBLICATIONS

T.H Hu, P. R. Gray, "A Monolithic 480 Mb/s Parallel AGC/Decision/Clock–Recovery Circuit in 1.2$\mu$m CMOS," IEEE J of Solid State Circuits, Vol. 28 No. 12, 1314–20 (1993).*

J.D.H. Alexander, "Clock Recovery from Random Binary Signals," Electronic Letters, vol. 11 No. 22, 541–42 (Oct. 1975).*

* cited by examiner

*Primary Examiner*—Stephen Chin
*Assistant Examiner*—Paul N Rupert
(74) *Attorney, Agent, or Firm*—Ryan, Mason & Lewis, LLP

(57) ABSTRACT

A PLL circuit that includes a sampled phase detector, a filter and a voltage-controlled oscillator (VCO) is disclosed. The sampled phase detector compares an incoming reference signal, $V_{ref}$, and the output of the VCO, $V_O$, to generate an error signal, $I_{err}$, representing the phase difference between the reference signal, $V_{ref}$, and the VCO output, $V_O$. The error signal, $I_{err}$, is filtered by a low pass filter and applied to the VCO to produce an output signal, $V_O$, that tracks the phase of the reference signal, $V_{ref}$. Jitter is reduced by reducing the delay between the sampled phase detector and the VCO. Delay is reduced by utilizing short current pulses, as opposed to the continuous charge-pump current produced by conventional sampled phase detectors. The sampled phase detector injects all the charge-pump current into the VCO at once, reducing the delay by up to half of a clock cycle. In a further implementation, the total delay in the feedback loop is reduced by applying a charge output current, $I_{err}$, that is known to be required within a predefined period of time. An additional charge injection can be applied to the VCO each time the phase error value is zero, for the anticipated oscillation period until the next zero crossing. Thus, short pulses charge current, $I_{err}$, are initially injected into the low pass filter following a zero crossing, to inject a similar charge for the estimated duration of the oscillation period, until the next zero crossing is predicted to occur.

42 Claims, 6 Drawing Sheets

PHASE-LOCKED LOOP (PLL) CIRCUIT CONTAINING A SAMPLED PHASE DETECTOR WITH REDUCED JITTER

CROSS-REFERENCE TO RELATED APPLICATIONS

The present invention is related to the following United States Patent Applications filed contemporaneously herewith: U.S. Pat. application Ser. No. 09/014,418, entitled "A Phase-Locked Loop (PLL) Circuit Containing a Sampled Phase Detector With Improved Frequency Acquisition,"; U.S. patent application Ser. No. 09/015,014, entitled "A Phase-Locked Loop (PLL) Circuit Containing a Phase Detector For Achieving Byte Alignment," and U.S. patent application Ser. No. 09/015,035."A Phase-Locked Loop (PLL) Circuit Containing a Sampled Phase Detector With Improved Frequency Acquisition," each assigned to the assignee of the present invention, filed contemporaneously herewith and incorporated by reference herein.

FIELD OF THE INVENTION

The present invention relates to phase-locked loop (PLL) circuits, and more particularly, to phase-locked loop (PLL) circuits containing a sampled phase detector.

BACKGROUND OF THE INVENTION

Phase-locked loop (PLL) circuits are frequently utilized to lock an oscillator in phase with a reference signal. PLL circuits are often utilized within receivers in digital communication systems to generate a local clock signal that is phase aligned with an incoming reference signal. The phase aligned local clock signal facilitates the receipt and processing of data sent by a transmitter in the communication system.

A conventional PLL circuit includes a phase detector, a filter and a voltage-controlled oscillator (VCO). In the conventional PLL circuit, the phase detector compares the incoming reference signal and the output of the VCO. The phase detector generates an error signal that is representative of the phase difference of the reference signal and the VCO output. The error signal is filtered and applied to the control input of the VCO to produce an output signal that tracks the phase of the reference signal.

Recently, a parallel receiver architecture has become popular in many digital communication systems. The parallel receiver recovers the clock from the incoming data sequence, typically using a PLL circuit. For a detailed discussion of a parallel receiver architecture and clock recovery, respectively, see T. H. Hu, P. R. Gray, "A Monolithic 480 Mb/s Parallel AGC/Decision/Clock-Recovery Circuit in 1.2-$\mu$m CMOS," I.E.E.E. J. of Solid-State Circuits, Vol. 28, No. 12, 1314–20 (1993) and J. D. H. Alexander, "Clock Recovery From Random Binary Signals," Electr. Lett., Vol. 11, No. 22, 541–42 (Oct. 1975), each incorporated by reference herein. Generally, the phase detector of a parallel receiver phase-locked loop (PLL) is frequently implemented as a sampled binary phase detector (SBPD).

A potential problem exists, however, for a PLL circuit based on a sampled binary phase detector (SBPD). Specifically, conventional sampled phase detectors generate a continuous charge output signal over the entire clock cycle to minimize the phase difference between the reference signal and the VCO output. The continuous output current, however, introduces an average delay of one-half of the clock cycle between the phase detector and the voltage-controlled oscillator (VCO). This delay significantly contributes to the oscillation of conventional PLL circuits based on sampled phase detectors around a phase error equal to zero (0). Thus, the phase difference between the reference signal and the VCO output never goes to zero and continues to oscillate around zero. Such oscillation may occur in any sampled nonlinear phase detector, where the output signal is constant during a clock cycle. If the oscillation is severe enough, the incoming data signal can be sampled in the wrong bit period. In addition, any amount of oscillation degrades the bit error rate of a receiver.

SUMMARY OF THE INVENTION

A PLL circuit is disclosed that includes a sampled phase detector, a filter and a voltage-controlled oscillator (VCO). The sampled phase detector compares an incoming reference signal, $V_{ref}$, and the output of the VCO, $V_O$, and generates an error signal, $I_{err}$, representing the phase difference between the reference signal, $V_{ref}$, and the VCO output, $V_O$. The error signal, $I_{err}$, is filtered by a low pass filter and applied to the VCO to produce an output signal, $V_O$, that tracks the phase of the reference signal, $V_{ref}$.

According to one aspect of the present invention, delay is reduced by replacing the continuous charge-pump current produced over an entire clock cycle by a conventional sampled phase detector with shorter current pulses of similar charge, thereby reducing jitter. The sampled phase detector injects all the charge-pump charge into the loop filter at once, reducing the effective delay by up to a half period.

According to another aspect of the present invention, the total delay in the feedback loop is reduced by applying a charge output current, $I_{err}$, that is known to be required for a predefined number of clock cycles. PLL circuits based on sampled phase detectors typically produce a phase error that oscillates around zero. Thus, an additional charge injection can be applied to the VCO each time the phase error value is crossing zero, for the anticipated oscillation period until the next zero crossing. For example, when the phase error changes sign from negative to positive, it is known that a positive current will be injected into the low pass filter for several cycles (until the next zero crossing from positive to negative phases error), in order to adjust the phase of the VCO output, $V_O$. Thus, the PLL circuit in accordance with the present invention generates a positive phase step that is applied to the VCO. In various embodiments, the phase step can be applied with or without a corresponding change to the frequency. All of the charge current, $I_{err}$, is injected into the low pass filter for the estimated duration of the oscillation period, until the next zero crossing is predicted to occur. If the duration of the oscillation period is underestimated, the sampled phase detector will continue normal processing for the additional clock cycles until the next zero crossing is detected. If the duration of the oscillation period is overestimated, thereby initially injecting charge current for too many clock cycles, the next zero crossing will be passed, and the sampled phase detector will continue normal processing for the additional clock cycles until the second zero crossing is detected.

DETAILED DESCRIPTION

Figure 1:
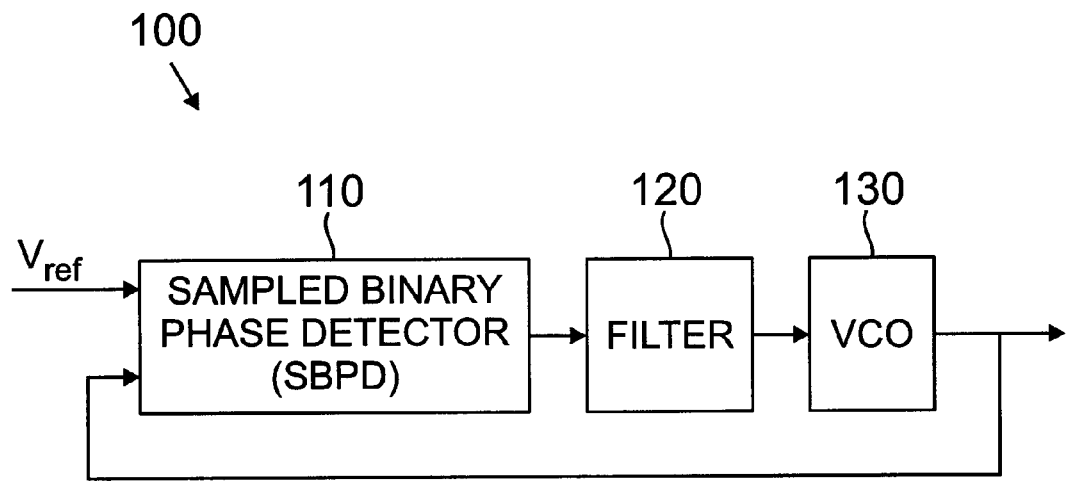
FIG. 1 is a schematic block diagram illustrating a conventional PLL circuit that locks an oscillator in phase with a reference signal.

FIG. 1 illustrates a conventional PLL circuit 100 that includes a phase detector 110, a low pass filter 120 and a voltage-controlled oscillator (VCO) 130. The phase detector 110 is embodied as a sampled phase detector, discussed below in conjunction with FIG. 2. The phase detector 110 compares the incoming reference signal, $V_{ref}$, and the output of the VCO, $V_O$. The phase detector 110 generates an error signal, $I_{err}$, representing the phase difference between the reference signal, $V_{ref}$, and the VCO output, $V_O$. The error signal, $I_{err}$, is filtered by the filter 120 and applied to the VCO 130 to produce an output signal, $V_O$, that tracks the phase of the reference signal, $V_{ref}$.

Figure 2:
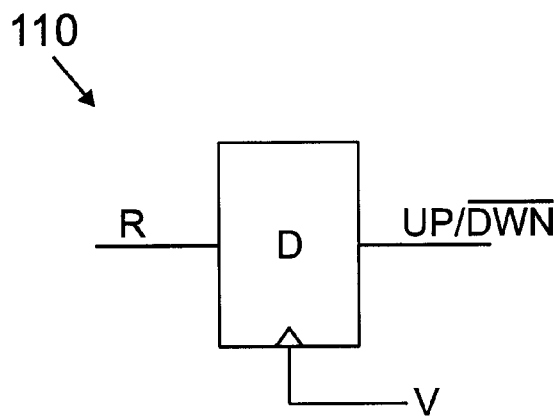
FIG. 2 is a schematic block diagram illustrating an example of the sampled phase detector of FIG. 1.
Figure 3:
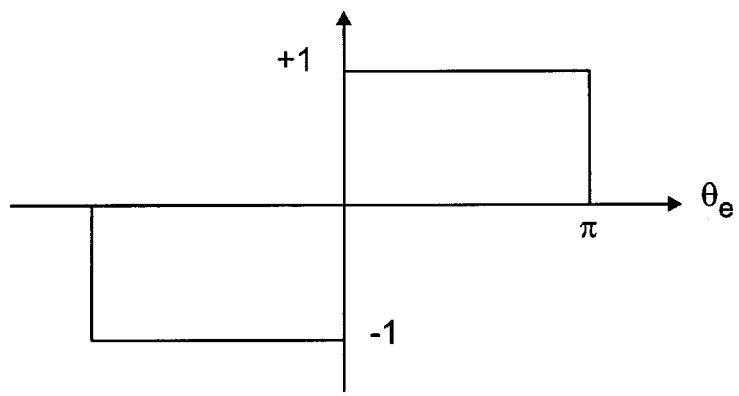
FIG. 3 illustrates the transfer characteristics of the sampled binary phase detector (SBPD) of FIG. 2.

The sampled phase detector can be embodied as a D-type flip flop, as shown in FIG. 2,. The sampled phase detector has the transfer characteristics shown in FIG. 3. Thus, the error signal, $I_{err}$, produced by the phase detector 110 depends only on the sign of the phase error, $\theta_{err}$, between the reference signal and the VCO output. While most phase detectors activate the charge pump of the VCO for a time proportional to the phase error, $\theta_{err}$, conventional sampled phase detectors apply the error signal, $I_{err}$, to the charge pump for the entire period, due to the sampled nature of the sampled phase detector.

In operation, if a positive edge of the VCO output, $V_O$, arrives to trigger the sampled phase detector 110, when the reference signal, $V_{ref}$, is high (binary "1"), the sampled phase detector 110 will produce an error signal, $I_{err}$, consisting of positive current, which is injected into the low pass filter 120, thereby causing an increase in the frequency of the VCO output, $V_O$. Likewise, if the reference signal, $V_{ref}$, is low (binary "0"), when a positive edge of the VCO output, $V_O$, arrives to trigger the sampled phase detector 110, then the sampled phase detector 110 will produce an error signal, $I_{err}$, consisting of negative current, which is injected into the low pass filter 120, thereby causing a decrease in the frequency of the VCO output, $V_O$. In this manner, the sampled phase detector adjusts the phase of the VCO 130 to align the positive edges of reference signal, $V_{ref}$, and the VCO output, $V_O$.

The phase detector shown in FIG. 2 locks the phase-locked loop (PLL) circuit if the reference signal, $V_{ref}$, is a square wave and the VCO output, $V_O$, has a sufficiently close frequency. The phase detector in FIG. 2 can be made decision directed so that it also works for the reference signal, $V_{ref}$, being a data signal, in a known manner. For a detailed discussion of a decision directed phase detectors, see J. D. H. Alexander, "Clock Recovery From Random Binary Signals," Electr. Lett., Vol. 11, No. 22, 541–42 (Oct. 1975), incorporated by reference above.

Figure 4:
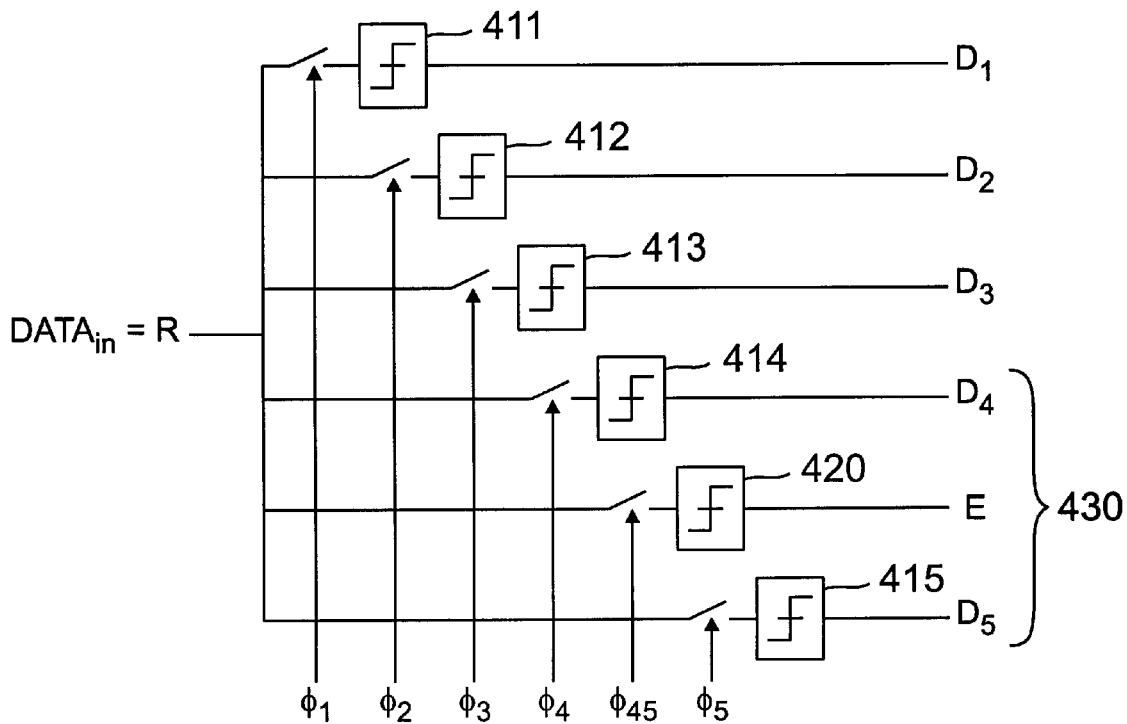
FIG. 4 is a schematic block diagram illustrating a conventional parallel data receiver circuit.
Figure 5:
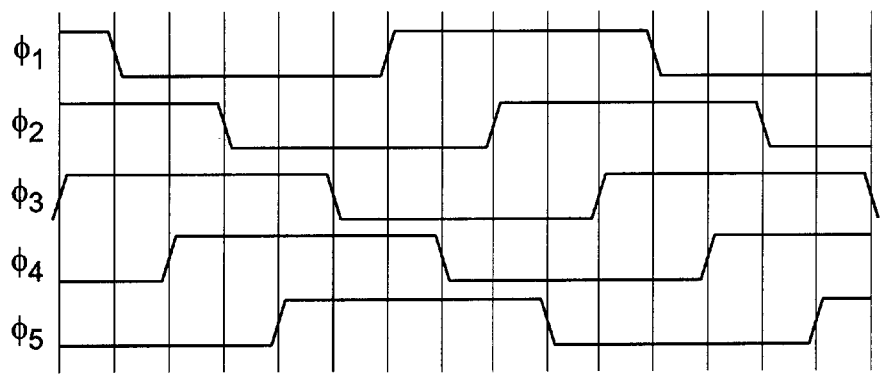
FIG. 5 illustrates the various clock cycles utilized to trigger the data samplers of FIG. 4.

FIG. 4 illustrates a conventional parallel data receiver circuit having five parallel data samplers 411–415 for sampling incoming data. As shown in FIG. 5, the clock phases, $\phi_1$–$\phi_5$, from the VCO output, $V_O$, are skewed by an amount equal to one-fifth of a clock cycle or period, and their rate is one-fifth of the rate of the incoming data. An edge detector 420 is clocked by a clock phase, $\phi_{45}$, which is between $\phi_4$ and $\phi_5$. Preferably, the edge detector 420 is triggered by the inverse of $\phi_2$, as shown in FIGS. 4 and 5. Thus, the sampled phase detector 420 only observes every fifth data edge. The edge detector 420, in cooperation with the two adjacent data samplers 414–415, operates as a phase detector 430. In this manner, the sampled phase detector 430 serves to align the VCO output, $\phi_2$, with the edge in between data bits $D_4$ and $D_5$. Thus, if there is a binary transition from high to low, for example, between data bits $D_4$ and $D_5$, the measurement of the edge detector 420 will also be either high or low, indicating whether the sampling is being done just before or just after the falling edge, respectively.

Figure 6:
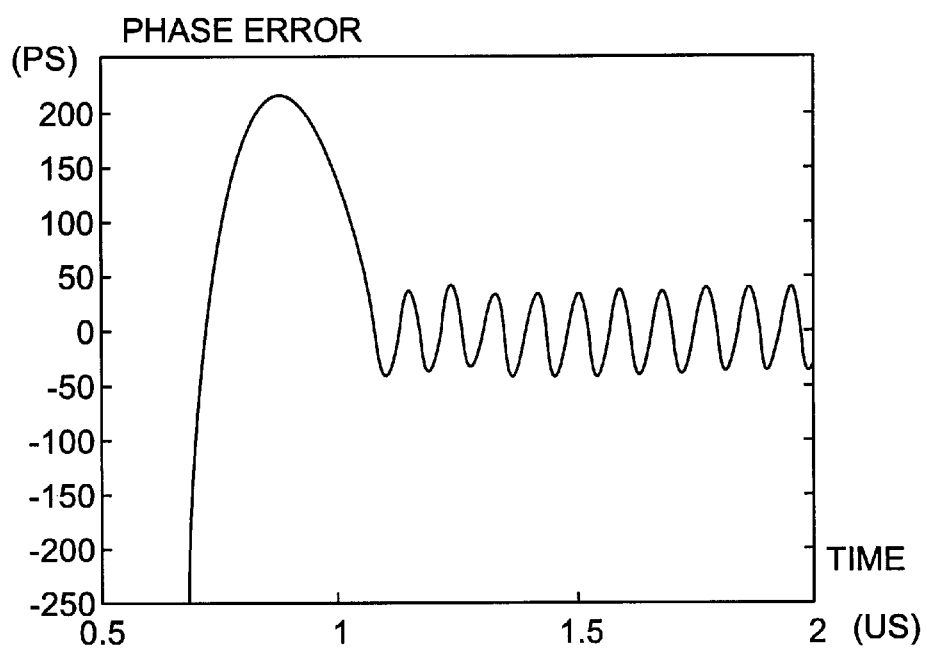
FIG. 6 illustrates the oscillation of the phase error produced between the reference signal and the VCO output for the conventional PLL circuit shown in FIG. 4.

Sampled phase detector-based PLL circuits, such as the one discussed above in conjunction with FIG. 4, tend to produce a phase error between the reference signal, $V_{ref}$, and the VCO output, $V_O$, oscillating around zero (0), as shown in FIG. 6. Thus, the error signal, $I_{err}$, indicating the phase difference between the reference signal, $V_{ref}$, and the VCO output, $V_O$, never goes to zero and continues to oscillate around zero. The oscillation is inherently problematic, if too large, because the incoming data will be sampled in the wrong bit period. Generally, oscillation in PLL circuits is attributed to two primary causes, namely, the non-linearity of the sampled phase detector and the delay in the sampled phase detector. The oscillation is more severe for nonlinear phase detectors.

Figure 7:
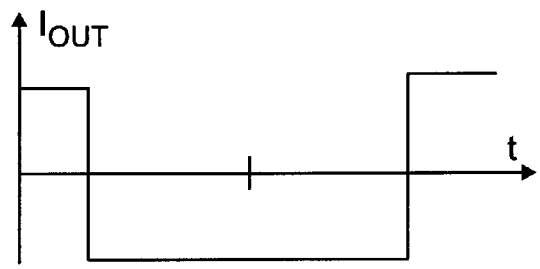
FIG. 7 illustrates the continuous charge output current produced by the conventional PLL circuit shown in FIG. 4 over the entire clock cycle or period.

While the oscillation attributed to non-linearity cannot be remedied, the oscillation attributed to the delay can be reduced or compensated for. The delay is caused by the sampled phase detector generating a continuous charge output current, $I_{err}$, over the entire clock cycle or period, as shown in FIG. 7, upon detecting a phase error, $\phi_{err}$, between the reference signal and the VCO output. Thus, the resultant average delay is half of a clock cycle.

Figure 8A:
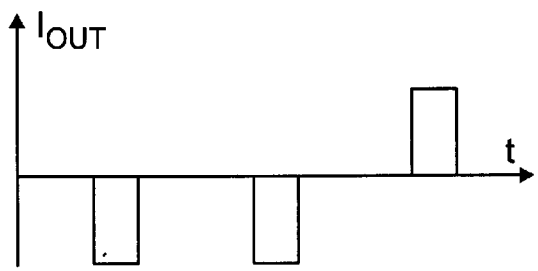
FIG. 8A illustrates the charge output current pulses produced by the PLL circuit in accordance with one embodiment of the present invention.
Figure 8B:
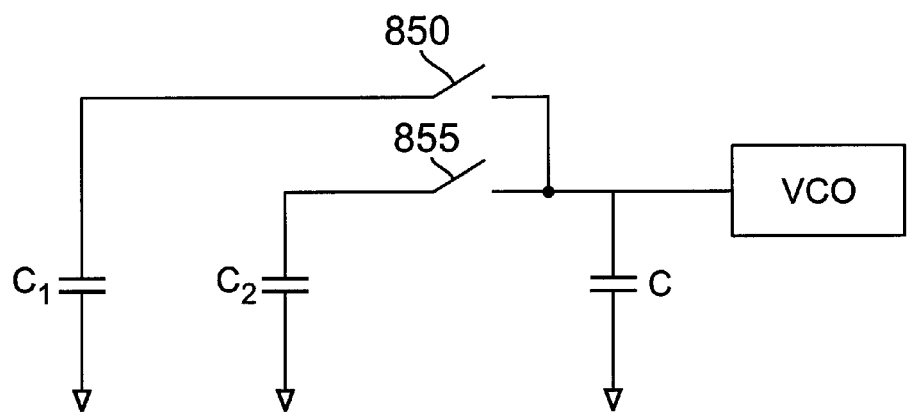
FIG. 8B illustrates a schematic diagram of a charge-pump, in accordance with an embodiment of the present invention, based on switched capacitors.

According to a feature of the present invention, this delay is reduced by replacing the continuous charge-pump current produced by the sampled phase detector 430 with shorter current pulses of similar charge, as shown in FIG. 8A. In this manner, the amount of charge-pump current that was previously injected over the entire period is injected into the VCO at once, thereby reducing the delay by up to a half period. The charge-pump current pulse shown in FIG. 8A can be generated, for example, by injecting current only when $\phi_2$ and $\phi_5$, shown in FIG. 5, are both high. FIG. 8B illustrates a charge-pump circuit based on switched capacitors. A charge-pump current pulse is generated by initially keeping both switches 850, 855 open, and putting a fixed charge onto capacitor $C_1$, and the opposite charge on capacitor $C_2$. Thereafter, the phase detector selects which switch 850, 855 to close, depending on the measured phase error, and injects the charge from either $C_1$ or $C_2$ into the low pass filter capacitor, C, to provide the narrow current pulse. According to a further feature of the present invention, the total delay in the feedback loop is reduced by applying a charge output current, $I_{err}$, that is known to be required within a predefined period of time. Specifically, for the phase variation shown in FIG. 6, an additional charge injection can be applied to the VCO at each zero crossing, for the anticipated oscillation period until the next zero crossing. For example, when the phase error changes sign from negative to positive, it is known that a positive current will be injected into the low pass filter for several cycles (until the next zero crossing from positive to negative phases error), in order to increase the phase of the VCO output, $V_O$.

Figure 9A:
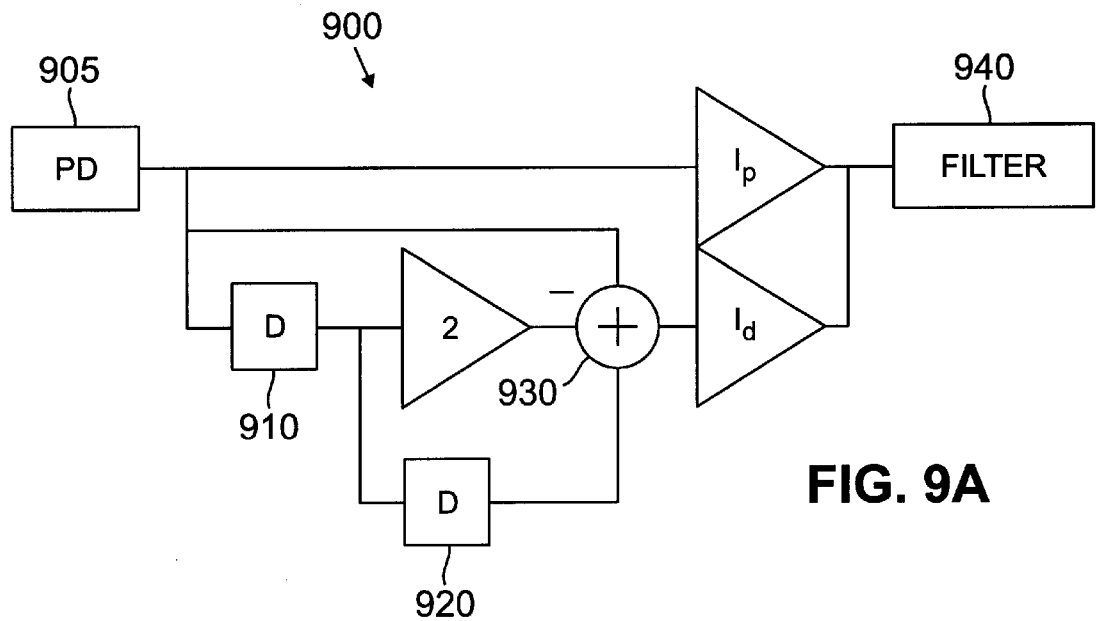
FIGS. 9A and 9B illustrate PLL circuits in accordance with two embodiments of the present invention that initially injects charge current into the VCO for the anticipated oscillation period until the next zero crossing.

The PLL circuit 900, shown in FIG. 9A, generates a pair of opposite polarity current pulses that produce a positive phase step that is applied to the VCO, without changing the frequency. The controller 900 consists of a direct path from the phase detector (PD) 905 that generates an output current with amplitude $I_p$. In addition, the controller 900 includes a few memories, such as simple D-type flip flops 910, 920, to store previous phase errors thereby making it possible to detect a zero crossing. The output of the memories (or delays) 910, 920 are combined, for example, by an adder 930 so as to generate output current pulses, such that the input current to the filter 940 is zero if the output of the phase detector 905 is constant. In order to obtain the current pulses shown in FIG. 10*a*, the values of $I_p$ and $I_d$ are selected by initially estimating the period of oscillation until the next zero crossing, and determining the maximum phase deviation from an ideal zero phase error. Once the maximum phase deviation is determined, the values of $I_p$ and $I_d$ are chosen such that the injected charge generates a phase step equal to the expected maximum phase error of oscillation.

Figure 9B:
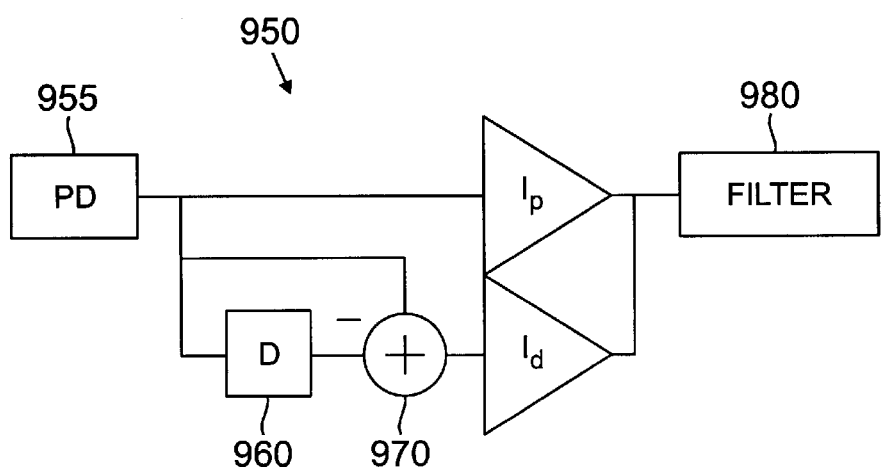

The PLL circuit 950, shown in FIG. 9B, generates a single current pulse that produce a positive phase step that is applied to the VCO, while also applying a frequency change. The controller 950 consists of a direct path from the phase detector (PD) 955 that generates an output current with amplitude $I_p$. In addition, the controller 950 includes a memory, such as a simple D-type flip flop 960, to store previous phase errors, thereby making it possible to detect a zero crossing. The output of the memory (or delay) 960 is combined, for example, by an adder 970, so as to generate output current pulses, such that the input current to the filter 980 is zero if the output of the phase detector 955 is constant. In order to obtain a single positive or negative current pulse, the values of $I_p$ and $I_d$ are selected by estimating the period of oscillation until the next zero crossing, and choosing $I_p$ and $I_d$ such that all of the charge expected to be injected until the next zero crossing. is all injected at the zero crossing Thus, all of the charge current, $I_{err}$, is injected into the low pass filter for the estimated duration of the oscillation period, until the next zero crossing is predicted to occur. Since the sampled phase detector may be a non-linear device, however, the oscillation period estimate may not be accurate. If the duration of the oscillation period is underestimated, the sampled phase detector will continue normal processing for the additional clock cycles until the next zero crossing is detected, such that a continuous current or charge pulse is applied for each clock period. If the duration of the oscillation period is overestimated, thereby initially injecting charge current for too many clock cycles, the next zero crossing will be passed, and the sampled phase detector will continue normal processing for the additional clock cycles until the second zero crossing is detected.

Figure 10A:
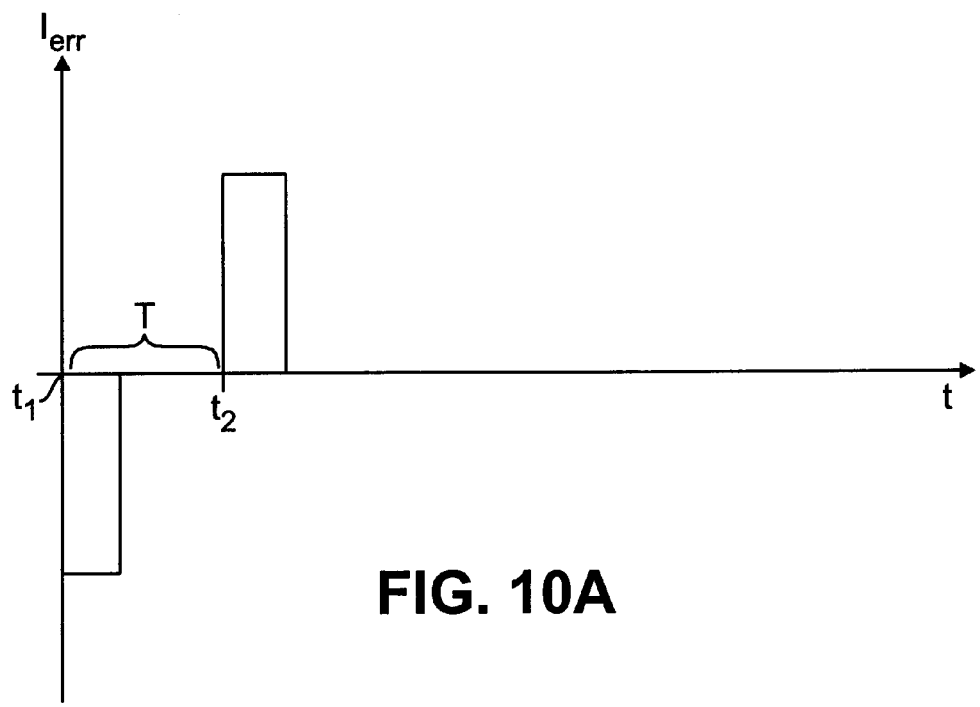
FIG. 10A illustrates the opposite polarity charge injection current pulses produced by the PLL circuit of FIG. 9A.
Figure 10B:
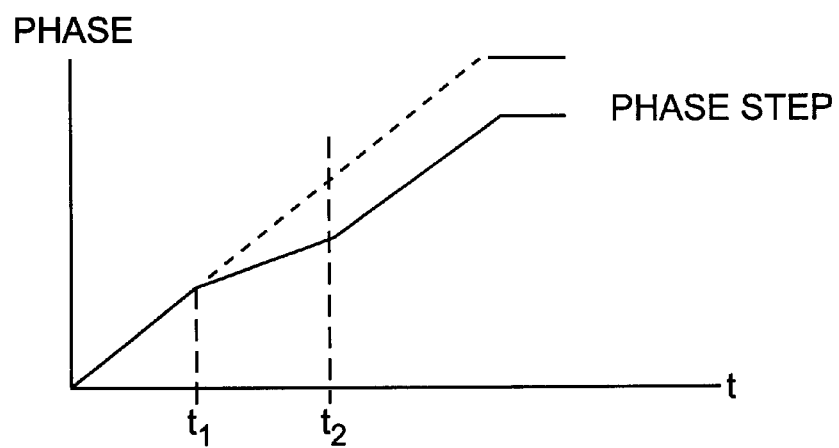
FIG. 10B illustrates the phase step produced by the PLL circuit of FIG. 9A.

As shown in FIG. 10A, a current pulse is generated by the circuit of FIG. 9A at a time $t_1$, after a zero crossing of the phase error, causing an initial frequency shift. In addition, a current pulse of opposite polarity is generated in the subsequent clock cycle (time $t_2$), such that a VCO phase step is generated, as shown in FIG. 10B, while also returning the frequency to the initial value (if $I_p=I_d$ in FIG. 9A).

It is to be understood that the embodiments and variations shown and described herein are merely illustrative of the principles of this invention and that various modifications may be implemented by those skilled in the art without departing from the scope and spirit of the invention.

I claim:

1. A phase-locked loop (PLL) circuit for generating an oscillator output signal having a clock cycle, comprising:

a sampled phase detector having a reference input, a feedback input and an output, the reference input being the input of said PLL, wherein an error signal is generated at the output of said sampled phase detector corresponding to the difference in phase of the signals at said first and second inputs, wherein said error signal consists of current pulses applied only for a portion of said clock cycle;

a loop filter having an input and an output, the input being connected to the error signal generated by the sampled phase detector; and a governable oscillator having a control terminal and an output, the control terminal being connected to the filtered error signal and the oscillator output being the output of the PLL and connected to said feedback input of said sampled phase detector, said oscillator output tracking the phase of the reference signal.

2. The phase-locked loop (PLL) circuit according to claim 1, wherein said governable oscillator is a voltage-controlled oscillator (VCO).

3. The phase-locked loop (PLL) circuit according to claim 1, wherein said loop filter is a low pass filter.

4. The phase-locked loop (PLL) circuit according to claim 1, wherein said sampled phase detector is a D-type flip flop.

5. The phase-locked loop (PLL) circuit according to claim 1, wherein said sampled phase detector is a sampled non-linear phase detector.

6. The phase-locked loop (PLL) circuit according to claim 1, wherein said sampled phase detector is decision directed.

7. The phase-locked loop (PLL) circuit according to claim 1, wherein said sampled phase detector is a sampled binary phase detector (SBPD).

8. A phase-locked loop (PLL) circuit comprising:

a sampled phase detector having a reference input, a feedback input and an output, the reference input being the input of said PLL, wherein an error signal is generated at the output of said sampled phase detector corresponding to the phase difference of the signals at said first and second inputs, wherein said error signal consists of a charge injection for the estimated duration of the oscillation period until said phase difference is predicted to be zero;

a loop filter having an input and an output, the input being connected to the error signal generated by the sampled phase detector; and a governable oscillator having a control terminal and an output, the control terminal being connected to the filtered error signal and the oscillator output being the output of the PLL and connected to said feedback input of said sampled phase detector, said oscillator output tracking the phase of the reference signal.

9. The phase-locked loop (PLL) circuit according to claim 8, wherein said governable oscillator is a voltage-controlled oscillator (VCO).

10. The phase-locked loop (PLL) circuit according to claim 8, wherein said loop filter is a low pass filter.

11. The phase-locked loop (PLL) circuit according to claim 8, wherein said sampled phase detector is a D-type flip flop.

12. The phase-locked loop (PLL) circuit according to claim 8, wherein said sampled phase detector is decision directed.

13. The phase-locked loop (PLL) circuit according to claim 8, wherein said sampled phase detector is a sampled nonlinear phase detector.

14. The phase-locked loop (PLL) circuit according to claim 8, wherein said sampled phase detector is a sampled binary phase detector (SBPD).

15. The phase-locked loop (PLL) circuit according to claim 8, wherein said charge injection consists of two opposite polarity current pulses.

16. A method for generating an oscillator output signal having a clock cycle, said method comprising the steps of:
comparing an input signal to said oscillator output signal;
generating an error signal corresponding to the difference in phase between said input signal and said oscillator output signal, wherein said error signal consists of current pulses applied for only a portion of said clock cycle;
filtering said error signal; and
applying said filtered error signal to a governable oscillator to generate said oscillator output signal, said oscillator output signal tracking the phase of the input signal.

17. The method according to claim 16, wherein said comparison step is performed by a phase detector.

18. The method according to claim 16, wherein said comparison step is performed by a sampled phase detector.

19. The method according to claim 16, wherein said governable oscillator is a voltage-controlled oscillator (VCO).

20. The method according to claim 16, wherein said comparison step is performed by a decision directed sampled phase detector.

21. The method according to claim 16, wherein said comparison step is performed by a sampled nonlinear phase detector.

22. The method according to claim 16, wherein said comparison step is performed by a sampled binary phase detector (SBPD).

23. A method for generating an oscillator output signal having a clock cycle, said method comprising the steps of:
comparing an input signal to said oscillator output signal;
generating an error signal corresponding to the difference in phase of said input signal and said oscillator output signal, wherein said error signal consists of a charge injection for the estimated duration of the oscillation period until said phase difference is predicted to be zero;
filtering said error signal; and
generating said oscillator output signal to track the phase of the input signal in accordance with said error signal.

24. The method according to claim 23, wherein said governable oscillator is a voltage-controlled oscillator (VCO).

25. The method according to claim 23, wherein said filtering step applies a low pass filter.

26. The method according to claim 23, wherein said comparison step is performed by a sampled phase detector.

27. The method according to claim 26, wherein said sampled phase detector is a D-type flip flop.

28. The method according to claim 23, wherein said charge injection consists of two opposite polarity current pulses.

29. The method according to claim 23, wherein said comparison step is performed by a decision directed sampled phase detector.

30. The method according to claim 23, wherein said comparison step is performed by a sampled nonlinear phase detector.

31. The method according to claim 23, wherein said comparison step is performed by a sampled binary phase detector (SBPD).

32. A method for adjusting the phase of an oscillator output signal, said method comprising the steps of:
comparing an input signal to said oscillator output signal; and
generating an error signal corresponding to the difference in phase between said input signal and said oscillator output signal, wherein said error signal consists of current pulses applied for only a portion of said oscillator output signal.

33. A method for adjusting the phase of an oscillator output signal, said method comprising the steps of:
comparing an input signal to said oscillator output signal; and
generating an error signal corresponding to the difference in phase of said input signal and said oscillator output signal, wherein said error signal consists of a charge injection for the estimated duration of the oscillation period until said phase difference is predicted to be zero.

34. A phase-locked loop (PLL) circuit for generating an oscillator output signal having a clock cycle, comprising:
a sampled phase detector having a reference input, a feedback input and an output, the reference input being the input of said PLL, wherein an error signal is generated at the output of said sampled phase detector corresponding to the difference in phase of the signals at said first and second inputs, wherein said error signal consists of current pulses applied only for a portion of said clock cycle; and
a governable oscillator having a control terminal and an output, the control terminal receiving a filtered version of the error signal generated by the sampled phase detector and the oscillator output being the output of the PLL and connected to said feedback input of said sampled phase detector, said oscillator output tracking the phase of the reference signal.

35. The phase-locked loop (PLL) circuit according to claim 34, wherein said governable oscillator is a voltage-controlled oscillator (VCO).

36. The phase-locked loop (PLL) circuit according to claim 34, wherein said sampled phase detector is a D-type flip flop.

37. The phase-locked loop (PLL) circuit according to claim 34, wherein said sampled phase detector is a sampled nonlinear phase detector.

38. The phase-locked loop (PLL) circuit according to claim 34, wherein said sampled phase detector is decision directed.

39. The phase-locked loop (PLL) circuit according to claim 34, wherein said sampled phase detector is a sampled binary phase detector (SBPD).

40. The phase-locked loop (PLL) circuit according to claim 34, wherein said error signal received by said governable oscillator is filtered.

41. A phase-locked loop (PLL) circuit for generating an oscillator output signal, comprising:

a sampled phase detector for comparing the phase of said oscillator output signal and a reference signal, wherein an error signal is generated at the output of said sampled phase detector corresponding to the difference in phase of the oscillator output and reference signals, wherein said error signal consists of a series of pulses, each of said pulses having a duration shorter than a period of said reference signal; and a governable oscillator for receiving a filtered version of the error signal generated by the sampled phase detector and for generating the oscillator output signal tracking the phase of the reference signal.

42. The phase-locked loop (PLL) circuit according to claim 41, wherein said governable oscillator is a voltage-controlled oscillator (VCO).

* * * * *